United States Patent [19]
Simmons et al.

[11] Patent Number: 5,223,751
[45] Date of Patent: Jun. 29, 1993

[54] LOGIC LEVEL SHIFTER FOR 3 VOLT CMOS TO 5 VOLT CMOS OR TTL

[75] Inventors: Laura E. Simmons; Richard W. Ulmer, both of Tempe; James Ward, Gilbert, all of Ariz.

[73] Assignee: VLSI Technology, Inc., San Jose, Calif.

[21] Appl. No.: 780,677

[22] Filed: Oct. 29, 1991

[51] Int. Cl.⁵ .................... H03K 19/017; H03K 3/01
[52] U.S. Cl. .................. 307/475; 307/296.3; 307/451
[58] Field of Search ................ 307/475, 296.3, 451

[56] References Cited

U.S. PATENT DOCUMENTS

| | | | |
|---|---|---|---|
| 4,837,462 | 6/1989 | Watanabe et al. | 307/475 |
| 4,844,563 | 7/1989 | MacMillan et al. | 307/475 |
| 4,926,070 | 5/1990 | Tanaka et al. | 307/475 |
| 4,929,853 | 5/1990 | Kim et al. | 307/475 |
| 4,965,469 | 10/1990 | Kondoh et al. | 307/475 |
| 5,115,434 | 5/1992 | Aizaki | 307/451 |

Primary Examiner—Edward P. Westin
Assistant Examiner—Richard Roseen
Attorney, Agent, or Firm—The Hickman Law Firm

[57] ABSTRACT

A logic level shifter characterized by a first inverting stage which shifts an input signal downwardly to a lower level, and a second inverting stage which shifts the lower level upwardly to an output signal level which is greater than the input signal level. Feedback from the output is used to virtually eliminate static current drain when the input logic level is 0. The method of the invention involves downwardly shifting an input range of voltages to a lower range of voltages, and then upwardly shifting the lower range of voltages to an output range of voltages which is greater than the input range of voltages. There is preferably a first inversion in the downward shift and a second inversion in the upward shift. A sensing step senses the output voltage to reduce the static current consumed by the process.

29 Claims, 2 Drawing Sheets

LOGIC LEVEL SHIFTER FOR 3 VOLT CMOS TO 5 VOLT CMOS OR TTL

BACKGROUND OF THE INVENTION

This invention relates generally to digital circuitry, and more particularly to logic level shifters for digital circuitry.

Portable computers are becoming very popular because they are easy to transport, can be used virtually anywhere, and because they are approaching the computing power of their desk-top brethren. Portable computers are also becoming smaller and lighter in weight, which generally means that the batteries which power them are also becoming smaller. As a result, the new generation of small, light, but powerful portable computers require low-power, yet high speed, circuitry.

Because portable computers are usually battery powered, it is very important that they draw as little power as possible. In consequence, the circuitry of virtually all portable computers is implemented in complementary metal oxide semiconductor (CMOS) technology, which is noted for its low power requirements. Also, the microprocessor or controller at the heart of the portable computer often operates internally on a lower voltage than the rest of the computer's circuitry to reduce its static power consumption. Unfortunately, lowering the voltage also reduces the speed at which the microprocessor or controller operates, which means that other portions of the circuitry must not unduly add to the delay of signals being produced by the microprocessor or controller.

In FIG. 1, a microprocessor or controller 10 can utilize an internal or "core" operating voltage of three volts d.c. but must drive external or "ring" logic at standard ISA (Industry Standard Architecture) voltages of about five volts d.c. This requires a logic level shifter 12 which couples the core logic to a pad driver 14 and, from there, to a lead 16 of the microprocessor or controller 10. The logic level shifter 12 must be capable of providing sufficient current to the pad driver 14. The pad driver 14 usually drives a capacitive load $C_L$ of about 200 picofarads.

A prior art logic level shifter 12' is illustrated in FIG. 2. The channel of a p-channel metal oxide field effect transistor (MOSFET) 18 and the channel of a n-channel MOSFET 20 are coupled together in a typical series CMOS configuration between a source of the ring voltage Vr and ground. The gates of the MOSFETS 18 and 20 are coupled to the input of the logic level shifter 12', and the node 22 between the channels of the MOSFETS is coupled to the pad driver 14. Typically, the relative size of the MOSFETS are selected so that the trip point between a logic 0 and a logic 1 are skewed towards the lower end of a voltage range. For example, if the voltage range is 0-3 volts, the trip point would be made less than 1.5 volts, while if the voltage range is 0-5 volts, the trip point would be made less than 2.5 volts. This skewing of the trip point enables the input signal "IN" to have a swing of 0 to 3 volts while generating an output signal that has a swing of 0 to 5 volts.

A problem with the prior art logic level shifter 12' of FIG. 2 is that it exhibits a relatively high static current. For example, when the input signal IN is at 3 volts, the output will be at 0 volts because the n-channel MOSFET 20 is on, but the p-channel MOSFET will not be shut entirely off. Therefore, current will flow from Vr to ground through MOSFETS 18 and 20. In consequence, there is a considerable static current drain through the level shifter 12', which can quickly deplete the batteries of a portable computer.

SUMMARY OF THE INVENTION

The present invention is a low power, high speed logic level shifter which is particularly well adapted for use in portable computers. The logic level shifter is preferably implemented in two inverting stages, where the first stage shifts the input "core" logic levels to a lower logic level range, and where the second stage shifts the lower logic level range to an output or "ring" logic range. Feedback is preferably used to virtually eliminate the static current in one or both of the stages.

A method of the present invention shifts a first range of voltages downwardly to a lower range of voltages and then shifts the lower range of voltages upwardly to a second range of voltages. One or both of the shifting steps may include a logic level inversion. The second range of voltages can be sensed to reduce the static current consumed by the process.

The present invention is preferably implemented in CMOS technology. Since the static current is virtually eliminated, the result is a very low power logic level shifter for battery-powered portable computers. The circuitry of the present invention is not significantly slower than the prior art logic level shifter of FIG. 2, and is quite suitable for use with standard 8 megahertz microcomputer busses.

These and other advantages of the present invention will become apparent to those skilled in the art upon a reading of the following specification of the invention and a study of the several figures of the drawing.

DETAILED DESCRIPTION OF THE PREFERRED EMBODIMENTS

Figure 1:
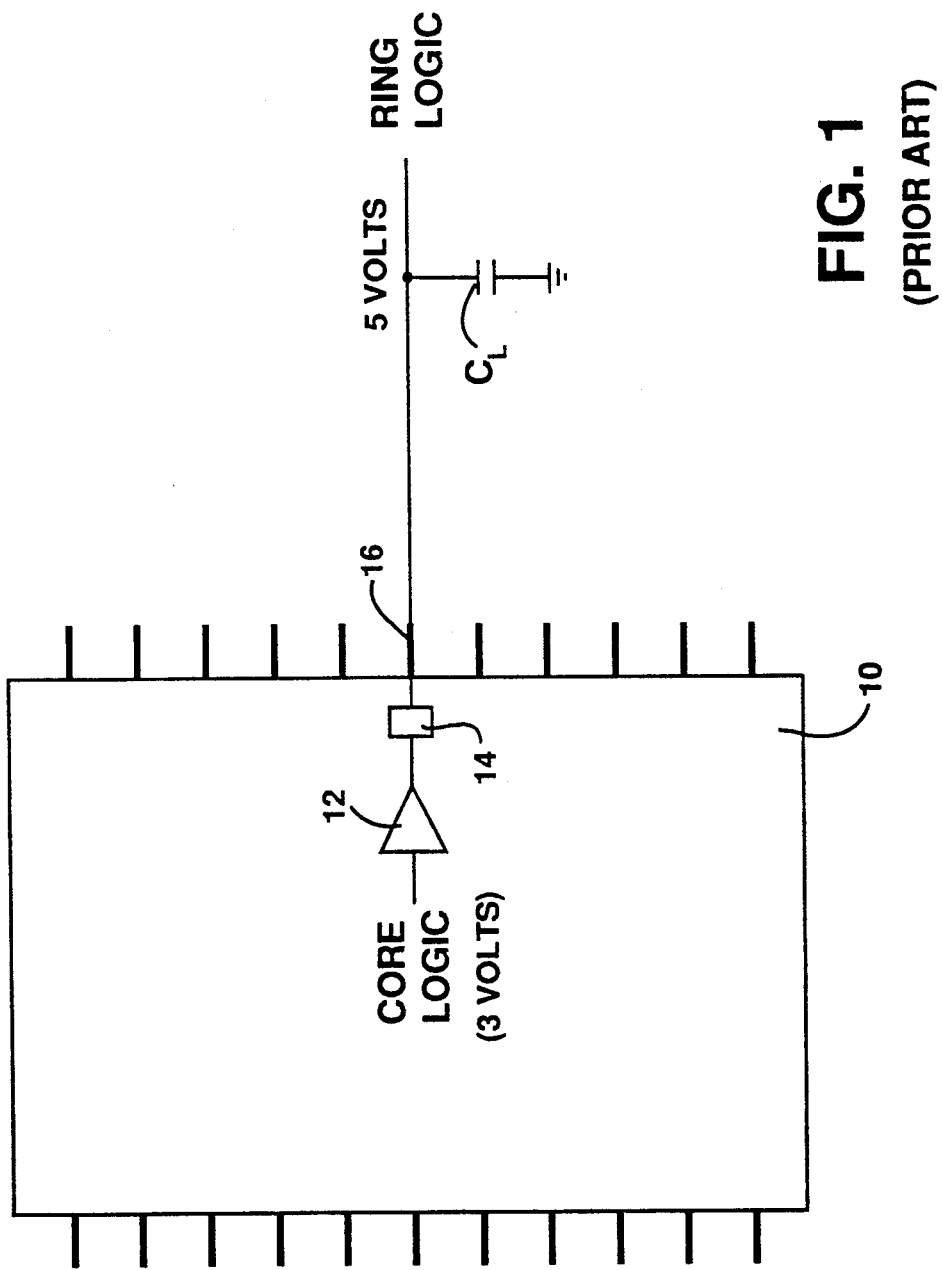
FIG. 1 is a diagram illustrating a typical prior art environment for a logic level shifter.
Figure 2:
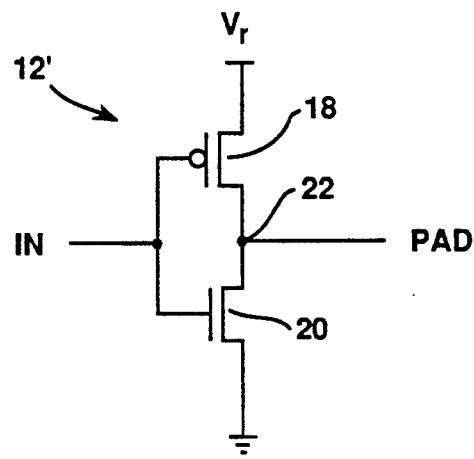
FIG. 2 is a schematic of a prior art logic level shifter.
Figure 3:
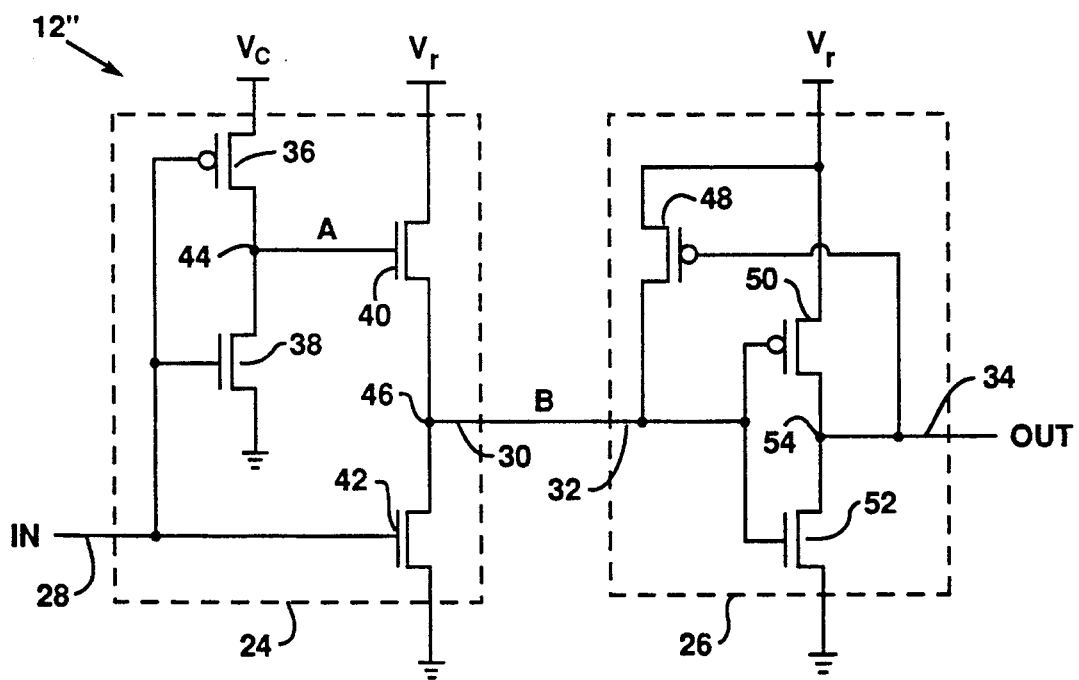
FIG. 3 is a schematic of a logic level shifter in accordance with the present invention.

The environment of the present invention and a prior art logic level shifter were discussed with reference to FIGS. 1 and 2, respectively. In FIG. 3, a logic level shifter 12" in accordance with the present invention includes a first stage 24 and a second stage 26. The first stage 24 has a first input 28 and a first output 30, and the second stage 26 has a second input 32 coupled to the first output 30, and a second output 34.

The first stage 24 is preferably coupled to two power supply levels corresponding to the core voltage level Vc and to the ring voltage level Vr. In this preferred implementation, Vc is about 3 volts d.c. and Vr is about 5 volts d.c. As will be discussed subsequently, it is also possible to provide different voltage levels for Vc and Vr to cause the circuitry to provide different functions. The first stage 24 includes a p-channel MOSFET 36 and three n-channel MOSFETS 38, 40, and 42. The channel of MOSFET 36 is coupled between Vc and a node 44, and the channel of MOSFET 38 is coupled between node 44 and a reference voltage (ground). The gates of MOSFETS 36 and 38 are coupled to first input 28. The channel of MOSFET 40 is coupled between Vr and a node 46, and the channel of MOSFET 42 is coupled between node 46 and ground. The gate of MOSFET 40 is coupled to node 44, and the gate of MOSFET 42 is coupled to first input 28. Node 46 is coupled to first output 30.

The second stage 26 is powered by a single power supply level Vr and includes two p-channel MOSFETS 48 and 50 and an n-channel MOSFET 52. The channel of MOSFET 48 is coupled between Vr and the second input 32, and the gate of MOSFET 48 is coupled to the second output 34. The MOSFET 48 serves as a feedback transistor to greatly reduce static current drain. The channel of MOSFET 50 is coupled between Vr and a node 54, and the channel of MOSFET 52 is coupled between node 54 and ground. The gates of MOSFETS 50 and 52 are coupled to second input 32, and node 54 is coupled to the second output 34.

The logic level shifter 12" consumes essentially no static current. When the input signal at first input 28 is at logic 0, the signal at a point A is raised to a logic 1 (3 volts) and the MOSFET 40 is turned on. This causes the signal at a point B shift downwardly to voltage lower than Vc. In the present embodiment the lower voltage level is about 2.5 volts, although a lower voltage within the range of 1.5 to 2.5 volts is also suitable. This turns on the MOSFET 52, pulling the second output 34 low to a logic level 0. MOSFET 50 is partially turned on, but is overpowered by MOSFET 52. When the second output 34 is a logic level 0, the MOSFET 48 is turned on, pulling the voltage level at point B to Vr (5 volts). The 5 volt level at point B MOSFET 50 completely turns off that transistor preventing any static current drain through the MOSFETS 50 and 52. The 5 volt level also completely shuts off MOSFET 40 because both sides of its channel are at the same voltage level. This prevents any static current from flowing through MOSFETS 40 and 42. The feedback MOSFET 48 therefore virtually eliminates static current in both the first stage 24 and the second stage 26 when the input logic level is 0.

When the first input 28 is a logic level 1 (3 volts) the signal at point B is a logic level 0. This causes the MOSFET 50 to be turned on hard and the MOSFET 52 to be completely shut off. This causes the second output voltage to go to 5 volts, shutting off the feedback MOSFET 48. Since MOSFET 38 is turned on, MOSFET 40 is turned off hard and there is virtually no static current flowing through MOSFETS 40 and 42. With MOSFET 50 turned off hard, there is virtually no static current flowing through MOSFETS 50 and 52. MOSFET 36 is also turned off hard, so there is virtually no static current flowing through MOSFETS 36 and 38. In consequence, there is only negligible static current flowing through either of stages 24 or 26 when the input logic level is 1.

It should be noted that the first stage 24 causes a first logic level inversion, and the second stage 26 causes a second logic level inversion. The second output 34 is therefore of the same polarity as the first input 28, even though the logic levels have been shifted upwardly. It is also possible to make the logic level converter 12" with non-inverting stages with essentially the same result, or to make the converter 12" with only one inverting stage, in which case there would be a polarity inversion between the first input 28 and the second output 34. For example, if the gate connections of MOSFETS 40 and 42 are swapped, i.e. the gate of MOSFET 40 is attached to first input 28 and the gate of MOSFET 42 is attached to node 44, first stage 24 is a non-inverting stage. Since second stage 26 is still an inverting stage, the logic level converter 12" will be an inverting logic level converter.

The following characteristics are typical of the logic level converter 12' when it is implemented in one micron CMOS technology. The dynamic estimates are based upon an assumption that there are clean current spikes on Vr only, that the circuit is operating at 8 megahertz, that industry standard bus cycles are used. The estimates also assume that the level shifter 12" drives a pad driver 14 which drives a capacitive load $C_L$ of approximately 200 picofarads.

| STATIC POWER: | zero watts |
|---|---|
| AVERAGE DYNAMIC POWER: | $CV^2F =$ (200 pf)(5.25 v)$^2$(8MHz/3) |
| | = 14.7 milliwatts |

A standard cell pad driver 14 with a 200 pf load is attached to the second output 34 of the logic level shifter. The following power characteristics were noted:

TABLE ONE

| Location | Signal Rise | Signal Fall |
|---|---|---|
| Pad Driver | 5.1 mW | 414 μW |
| Second Output 34 (Vr = 5v) | 5.87 μW | 105 μW |
| First Output 30 (Vr = 3v) | 373 nW | 3.2 μW |

With a rising edge at the first input 28 (i.e. the input signal is changing from a logic level 0 to a logic level 1) the power consumed is:

Power ≈ 373 nW + 105 μW + 5.1 mW ≈ 5.205 mW

With a falling edge at the first input 28 (i.e. the input signal is changing from a logic level 1 to a logic level 0) the power consumed is:

Power ≈ 3.2 μW + 5.87 μW + 414 μW ≈ 423.1 μW

The worst case time delays for the logic level shifter 12" are as follows:

TABLE TWO

| Location | Signal Rise | Signal Fall |
|---|---|---|
| Level Shifter 12" | 3.1 ns | 1.82 ns |
| Pad 14 | 16.6 ns | 8.48 ns |
| TOTAL | 19.7 ns | 10.3 ns |

These time delays are well within the specifications for a standard microcomputer 8 megahertz bus.

It should be noted that the power inputs Vc and Vr of the first stage 24 and the power input Vr of the second stage permits a certain amount of programming of the functionality of the logic level shifter 12". For example, if Vc=Vr=5 volts and the first input 28 operates in the 0-5 volt range, the logic level shifter serves as a low-power, high-speed, ISA compatible buffer. As another example, if Vc=Vr=3 volts, the logic level shifter serves as a low-power, high-speed buffer for 0-3 volt logic devices. Since some devices operate at 3 volts, others at 5 volts, and some at both 3 and 5 volts, it is useful to have a the same circuit be able to serve as a 3 or 5 volt buffer or as a 3-to-5 volt logic level shifter.

While this invention has been described in terms of several preferred embodiments, it is contemplated that alterations, modifications and permutations thereof will become apparent to those skilled in the art upon a reading of the specification and study of the drawings. It is therefore intended that the following appended claims include all such alterations, modifications and permutations as fall within the true spirit and scope of the present invention.

What is claimed is:

1. A logic level shifter comprising:
a first stage having a first input and a first output, wherein a voltage level at said first input can range from a reference voltage to a first voltage, said first stage being coupled to a source of a second voltage which is greater than said first voltage, and wherein a voltage level at said first output is responsive to said voltage level at said first input and can range from said reference voltage to a lower voltage which is less than said first first voltage; and a second stage having a second input and a second output, said second input being coupled to said first output of said first stage, said second stage being further coupled to a source of said second voltage, wherein a voltage level at said second output is responsive to said voltage level at said first output and can range from said reference voltage to said second voltage.

2. A logic level shifter as recited in claim 1 further comprising feedback means responsive to said voltage level at said second output and coupled to said second input operative to reduce the static current through at least one of said first and second stages.

3. A logic level shifter as recited in claim 1 wherein said first voltage is about three volts d.c. and wherein said second voltage is about five volts d.c.

4. A logic level shifter as recited in claim 1 wherein said first stage is further coupled to a source of said first voltage.

5. A logic level shifter as recited in claim 4 wherein said first stage includes:
a first transistor means of a first polarity type coupled at a first node to a second transistor means of a second polarity type, said first transistor means and said second transistor means being coupled in series between said source of said first voltage and said reference voltage, wherein the gates of said first transistor means and said second transistor means are coupled to said first input; and
a third transistor means of said second polarity type coupled at a second node to a fourth transistor means of said second polarity type, said third transistor means and said fourth transistor means being coupled in series between said second voltage and said reference voltage, wherein a gate of said third transistor means is coupled to said first node, a gate of said fourth transistor means is coupled to said first input, and wherein said second node is coupled to said first output.

6. A logic level shifter as recited in claim 5 wherein said second stage includes:
a fifth transistor means of said first polarity type coupled between said source of said second voltage and said second input; and
a sixth transistor means of said first polarity type coupled at a third node to a seventh transistor of said second polarity type, wherein said sixth transistor means and said seventh transistor means are coupled in series between said source of said second voltage and said reference voltage, wherein gates of said sixth transistor means and said seventh transistor means are coupled to said second input; and wherein said third node is coupled to said second output and to a gate of said fifth transistor means.

7. A logic level shifter as recited in claim 1 wherein said second stage includes:
a first transistor means of a first polarity type coupled between said source of said second voltage and said second input; and
a second transistor means of said first polarity type coupled at a node to a third transistor of a second polarity type, wherein said second transistor means and said third transistor means are coupled in series between said source of said second voltage and said reference voltage, wherein gates of said second transistor means and said third transistor means are coupled to said second input; and wherein said node is coupled to said second output and to a gate of said first transistor means.

8. A logic level shifter as recited in claim 1 wherein said first output of said first stage is an inversion of said first input of said first stage.

9. A logic level shifter as recited in claim 8 wherein said second output of said second stage is an inversion of said second input of said second stage.

10. A logic level shifter as recited in claim 1 wherein said second output of said second stage is an inversion of said second input of said second stage.

11. A logic level shifter comprising:
power supply means operative to develop a ring logic voltage;
input means having a first input and a first output, said input means being powered by said ring logic voltage and responsive to a first range of voltages at said first input varying between ground and a core logic voltage which is less than said ring logic voltage;
output means having a second input coupled to said first output and powered by said ring logic voltage and operative to develop a second range of voltages at a second output varying between ground and said ring logic voltage; and
feedback means responsive to said second range of voltages and coupled to said second input to reduce the static current of said logic level shifter.

12. A logic level shifter as recited in claim 11 wherein said power supply means further develops a core logic voltage, said input means being further powered by said core logic voltage, wherein said input means develops a lower range of voltages varying between ground and a lower voltage which is less than said core logic voltage in response to said voltage level at said input means, and wherein said output means is responsive to said lower range of voltages.

13. A logic level shifter as recited in claim 11 wherein said ring logic voltage is about five volts d.c.

14. A logic level shifter as recited in claim 12 wherein said ring logic voltage is about five volts d.c. and said core logic voltage is about three volts d.c.

15. A logic level shifter as recited in claim 12 wherein said lower voltage is about 1.5-2.5 volts d.c.

16. A logic level shifter as recited in claim 12 wherein said lower range of voltages is an inversion of said first range of voltages.

17. A logic level shifter as recited in claim 16 wherein said second range of voltages. an inversion of said lower range of voltages.

18. A logic level shifter as recited in claim 12 wherein said second range of voltages is an inversion of said lower range of voltages.

19. A method for shifting logic levels comprising:
shifting a first range of voltages which varies from a reference voltage to a first voltage downwardly to a lower range of voltages which varies from said reference voltage to a lower voltage which is less than said first voltage; and
shifting said lower range of voltages upwardly to a second range of voltages which varies from said reference voltage to a second voltage which is greater than said lower voltage.

20. A method for shifting logic levels as recited in claim 19 further comprising the step of inverting said first range of voltages to develop said lower range of voltages.

21. A method for shifting logic levels as recited in claim 20 further comprising the step of inverting said lower range of voltages to develop said second range of voltages.

22. A method for shifting logic levels as recited in claim 19 further comprising the step of inverting said lower range of voltages to develop said second range of voltages.

23. A method for shifting logic levels as recited in claim 19 further comprising sensing said second range of voltages and reducing the static current in response thereto.

24. A method for shifting logic levels as recited in claim 19 wherein said reference voltage is at about ground potential, said first voltage is about three volts and said second voltage is about five volts.

25. A method for shifting logic levels as recited in claim 24 wherein said lower voltage is about 1.5 to 2.5 volts.

26. A logic level shifter comprising:
a first stage having a first signal input, a first signal output, and a first power input;
a second stage having a second signal input, a second signal output, and a second power input, where said second signal input is coupled to said first signal output, said second signal output being responsive to said first signal input; and
feedback means having an input coupled to said second signal output and an output coupled to said second signal input to reduce the static current in said logic level shifter.

27. A logic level shifter as recited in claim 26 wherein said first power input and said second power input are of approximately the same voltage, and wherein said first stage further comprises a third power input.

28. A logic level shifter as recited in claim 27 wherein said third power input is of approximately the same voltage as said first power input and said second power input.

29. A logic level shifter as recited in claim 28 wherein said third power input is of a lower voltage than said first power input and said second power input.

* * * * *